(12) United States Patent
Lee et al.

(10) Patent No.: US 6,485,997 B2
(45) Date of Patent: Nov. 26, 2002

(54) METHOD FOR MANUFACTURING FRINGE FIELD SWITCHING MODE LIQUID CRYSTAL DISPLAY DEVICE

(75) Inventors: Kyung Ha Lee, Kyoungki-do (KR); Sung Hyun Cho, Kyoungki-do (KR)

(73) Assignee: Hyundai Display Technology, Inc., Kyoungki-do (KR)

( * ) Notice: Subject to any disclaimer, the term of this patent is extended or adjusted under 35 U.S.C. 154(b) by 133 days.

(21) Appl. No.: 09/737,670

(22) Filed: Dec. 15, 2000

(65) Prior Publication Data

US 2001/0007779 A1 Jul. 12, 2001

(30) Foreign Application Priority Data

Dec. 22, 1999 (KR) .............................. 99-60325

(51) Int. Cl.⁷ .............................................. H01L 21/66
(52) U.S. Cl. ........................................ 438/30; 438/158
(58) Field of Search ................................... 438/30, 158

(56) References Cited

U.S. PATENT DOCUMENTS

| | | | | |
|---|---|---|---|---|
| 5,953,084 A | * | 9/1999 | Shimada et al. | 349/38 |
| 6,046,063 A | * | 4/2000 | Jun et al. | 438/155 |
| 6,081,308 A | * | 6/2000 | Jeong et al. | 257/59 |
| 6,319,760 B1 | * | 11/2001 | Lee et al. | 349/42 |
| 6,323,521 B1 | * | 11/2001 | Seo | 257/282 |
| 6,331,443 B1 | * | 12/2001 | Lee et al. | 438/151 |
| 6,362,858 B1 | * | 3/2002 | Jeon et al. | 349/141 |
| 6,380,098 B1 | * | 4/2002 | Jeong et al. | 438/745 |
| 6,388,726 B1 | * | 5/2002 | Kim et al. | 349/141 |

* cited by examiner

Primary Examiner—John F. Niebling
Assistant Examiner—Stacy A Whitmore
(74) Attorney, Agent, or Firm—Ladas & Parry

(57) ABSTRACT

The present invention discloses a method for manufacturing a fringe field switching mode liquid crystal display device. Here, a counter electrode, gate bus line and common electrode line are formed by one photolithography process including: a first process for coating a resist film on the MoW film; a second process for forming a resist pattern consisting of first and second patterns respectively covering gate bus line and common electrode line formation regions and maintaining a coating thickness, and a third pattern covering a counter electrode formation region and partially maintaining the coating thickness, by exposing/developing the resist film; a third process for forming the gate bus line and the common electrode line by dry-etching the MoW film using the resist pattern as an etch barrier, the first and second patterns being partially removed, the third pattern being completely removed, the MoW film on the counter electrode formation region being partially removed; a fourth process for forming the counter electrode by wet-etching the ITO film using the remained resist pattern and MoW film as an etch barrier; and a fifth process for removing the remained resist pattern and MoW film.

7 Claims, 6 Drawing Sheets

METHOD FOR MANUFACTURING FRINGE FIELD SWITCHING MODE LIQUID CRYSTAL DISPLAY DEVICE

BACKGROUND OF THE INVENTION

1. Field of the Invention

The present invention relates to a method for manufacturing a liquid crystal display device, and in particular to a method for manufacturing a fringe field switching mode liquid crystal display device which can reduce a manufacturing time and cost.

2. Description of the Background Art

An in-plane switching (IPS) mode liquid crystal display device has been suggested to improve a narrow field angle of a TN mode liquid crystal display device. As publicly known, in the IPS mode liquid crystal display device, a counter electrode and a pixel electrode for driving a liquid crystal are aligned in parallel on an identical substrate. The field angle is improved according to a major axis of liquid crystal molecules, regardless of a direction in which a user watches a screen. The IPS mode liquid crystal display device has a wider field angle than the TN mode liquid crystal display device. However, the counter electrode and the pixel electrode consist of an opaque metal, and thus its aperture ratio and transmittance are poor.

Accordingly, in order to improve the aperture ratio and transmittance of the IPS mode liquid crystal display device, there has been taught a fringe field switching mode liquid crystal display device(hereinafter, referred to as 'FFS mode LCD') wherein the liquid crystal molecules are driven by a fringe field.

In the FFS mode LCD, the counter electrode and the pixel electrode consist of a transparent material such as an indium tin oxide (ITO), and an interval between the counter electrode and the pixel electrode is smaller than an interval between upper and lower substrates. In addition, the counter electrode and the pixel electrode have a sufficient width so that the liquid crystal molecules on the electrodes can be all driven. Since the electrodes consist of the transparent material, the FFS mode LCD obtains a more improved aperture ratio than the IPS mode LCD. Moreover, the light permeability occurs in the electrodes, and thus the FFS mode LCD obtains a more improved transmittance than the IPS mode LCD.

FIG. 1 is a cross-sectional diagram illustrating the lower substrate in the conventional FFS mode LCD. A method manufacturing the FFS mode LCD will now be described with reference to FIG. 1.

An ITO film is deposited on a glass substrate 1. The ITO film is patterned according to a first photolithography process, thereby forming a counter electrode 2 in a plate shape. An MoW film is deposited on the counter electrode 2 and the glass substrate 1 and then the MoW film is patterned according to a second photolithography process, thereby forming a gate bus line 3 and a common electrode line 4.

A gate insulating film 5 is formed over the resultant structure. An undoped amorphous silicon film and a doped amorphous silicon film are sequentially deposited on the gate insulating film 5 and then the doped amorphous silicon film and the undoped amorphous silicon film are patterned according to a third lithography process, thereby forming an ohmic contact layer 7 and a channel layer 6. A metal film for source/drain is deposited over the resultant structure. The metal film is patterned according to a fourth lithography process, thereby forming a data bus line(not shown) including source and drain electrodes 8a, 8b. As a result, a thin film transistor (TFT) is formed.

A passivation film 9 is deposited over the resultant structure. Thereafter, the passivation film 9 is etched according to a fifth photolithography process so that the source electrode 8a can be partially exposed. An ITO film is deposited on the passivation film 9 and then patterned according to a sixth photolithography process, thereby forming a comb-shaped pixel electrode 10 having a few branches and contacting with the source electrodes 8a of the TFT.

However, the conventional method for manufacturing the FFS mode LCD has a disadvantage in that six photolithography processes are performed to form the lower substrate, which results in an increased manufacturing time and cost.

In more detail, the photolithography process includes a process for forming a resist pattern such as resist coating, exposure and development processes, an etching process using the resist pattern, and a process for removing the resist pattern. Therefore, even one photolithography process takes a long time. Accordingly, the conventional method for manufacturing the FFS mode LCD by performing the six photolithography processes is not advantageous in productivity. In addition, the etching process requires a mask for exposure that is very expensive. Thus, the six photolithography processes require six masks for exposure. As a result, the conventional method for manufacturing the FFS mode LCD is not advantageous in cost, either.

SUMMARY OF THE INVENTION

Therefore, an object of the present invention is to provide a method for manufacturing a fringe field switching mode liquid crystal display device which can reduce a manufacturing time and cost.

In order to achieve the above-described object of the present invention, a method for manufacturing a fringe field switching mode liquid crystal display device includes the steps of: forming a counter electrode, a gate bus line and a common electrode line at the same time, by sequentially depositing an indium tin oxide film and an MoW film on a glass substrate, and patterning the MoW film and the ITO film according to a first photolithography process; depositing a gate insulating film over the resultant structure; forming a stacked channel layer and ohmic contact layer on a predetermined portion of the gate insulating film, by using a second photolithography process; forming a data bus line including source/drain electrodes on the ohmic contact layer and the gate insulting film, by using a third photolithography process; forming a passivation film to expose the source electrode over the resultant structure, by using a fourth photolithography process; and forming a pixel electrode of a comb shape in contact with the source electrode on the passivation film, by using a fifth photolithography process, wherein the first photolithography process comprises: a first process for coating a resist film on the MoW film; a second process for forming a resist pattern consisting of first and second patterns respectively covering gate bus line and common electrode line formation regions and maintaining a coating thickness, and a third pattern covering a counter electrode formation region and partially maintaining the coating thickness, by exposing and developing the resist film; a third process for forming the gate bus line and the common electrode line by dry-etching the MoW film using the resist pattern as an etch barrier, the first and second patterns being partially removed, the third pattern being completely removed, the MoW film on the counter electrode formation region being partially removed; a fourth process for forming the counter electrode by wet-etching the ITO film using the remained resist pattern and MoW film as an etch barrier; and a fifth process for removing the remained resist pattern and MoW film.

BRIEF DESCRIPTION OF THE DRAWINGS

The present invention will become better understood with reference to the accompanying drawings that are given only by way of illustration and thus are not limitative of the present invention, wherein.

DETAILED DESCRIPTION OF THE PREFERRED EMBODIMENTS

Figure 1:
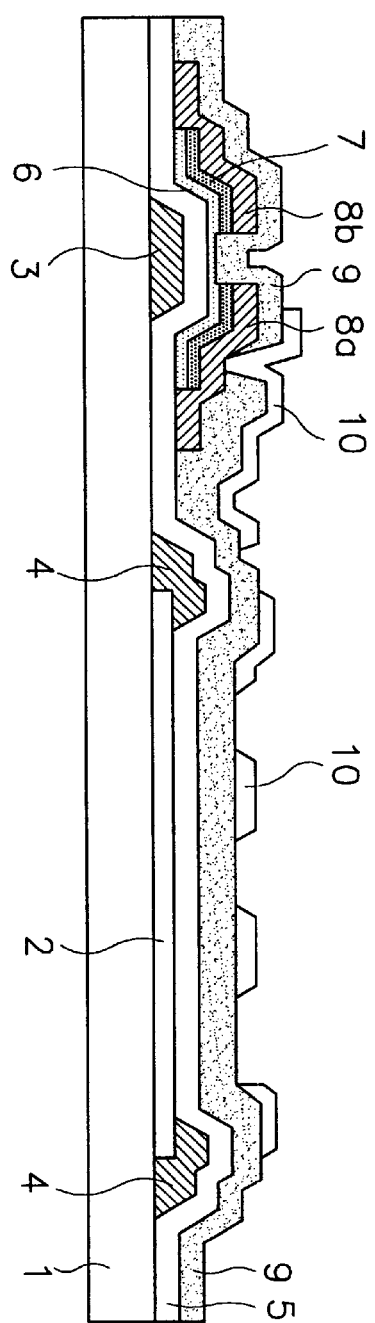
FIG. 1 is a cross-sectional diagram illustrating a lower substrate in a conventional FFS mode LCD.
Figure 2A:
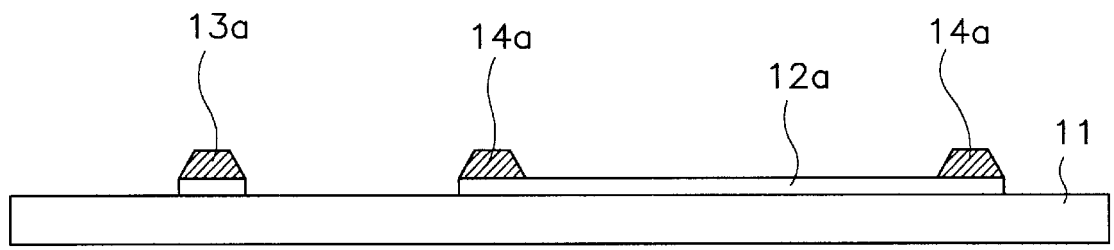
FIGS. 2A to 2C are cross-sectional diagrams illustrating sequential steps of a method for manufacturing an FFS mode LCD in accordance with the present invention.
Figure 2B:
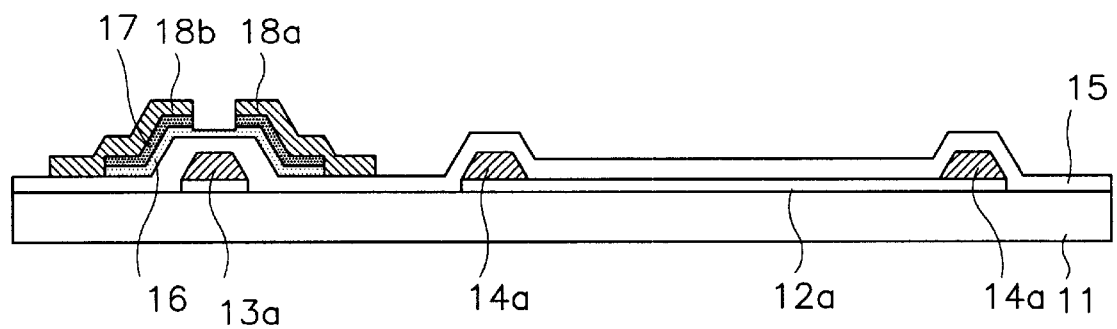
Figure 2C:
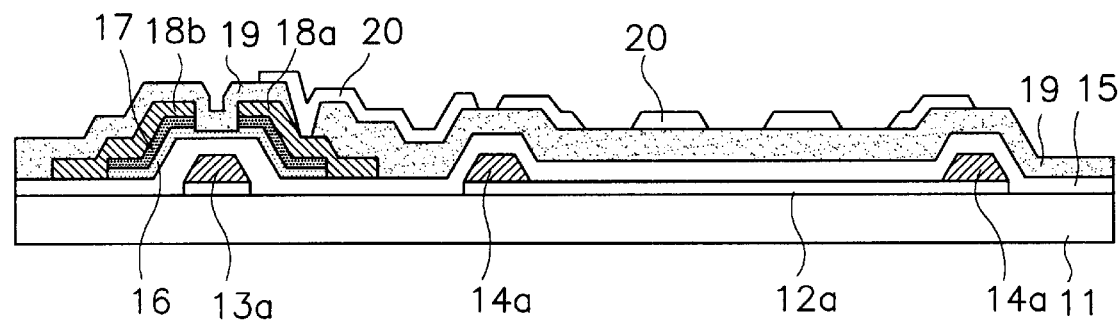

FIGS. 2A to 2C are cross-sectional diagrams illustrating sequential steps of a method for manufacturing a fringe field switching mode liquid crystal display device (hereinafter, referred to as 'FFS mode LCD') in accordance with the present invention.

Referring to FIG. 2A, a glass substrate 11 consists of a transparent insulating substrate. An indium tin oxide (ITO) film and a MoW film are sequentially deposited on the glass substrate 11. The ITO film is a transparent metal film for a counter electrode, and the MoW film is an opaque metal film for a gate bus line and a common electrode line. The MoW film and the ITO film are patterned according to a first photolithography process, thereby forming a counter electrode 12a, a gate bus line 13a and a common electrode line 14a at the same time.

Herein, the first photolithography process for forming the counter electrode 12a, gate bus line 13a and common electrode line 14a will now be explained with reference to FIGS. 3A to 3D.

Figure 3A:
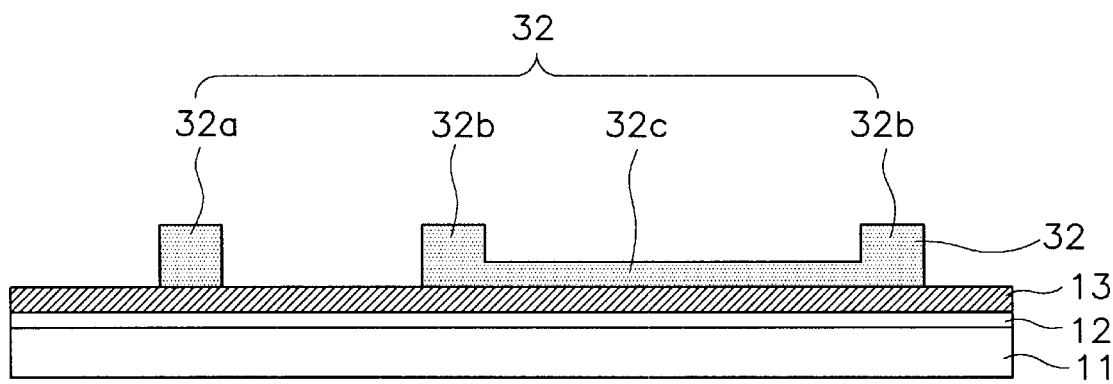
FIGS. 3A to 3D are cross-sectional diagrams illustrating sequential steps of a first photolithography process in accordance with the present invention.

In FIG. 3A, a resist pattern 32 is formed on the MoW film 13 as an etch barrier. The resist pattern 32 has a different thickness in each region. That is, the resist pattern 32 consists of a first pattern 32a covering a gate bus line formation region, a second pattern 32b covering a common electrode line formation region, and a third pattern 32c covering a counter electrode formation region. The third pattern 32c has a smaller thickness than the first and second patterns 32a, 32b.

In order to form such a resist pattern 32, an exposure process is performed on the resist film by employing a semipermeable mask.

Figure 4A:
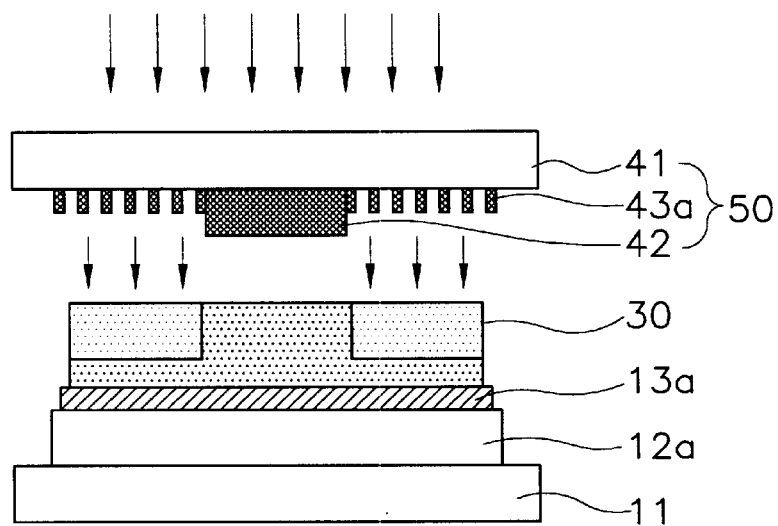
FIGS. 4A to 4C are cross-sectional diagrams illustrating sequential steps of a method for forming a resist pattern in accordance with the present invention.
Figure 4B:
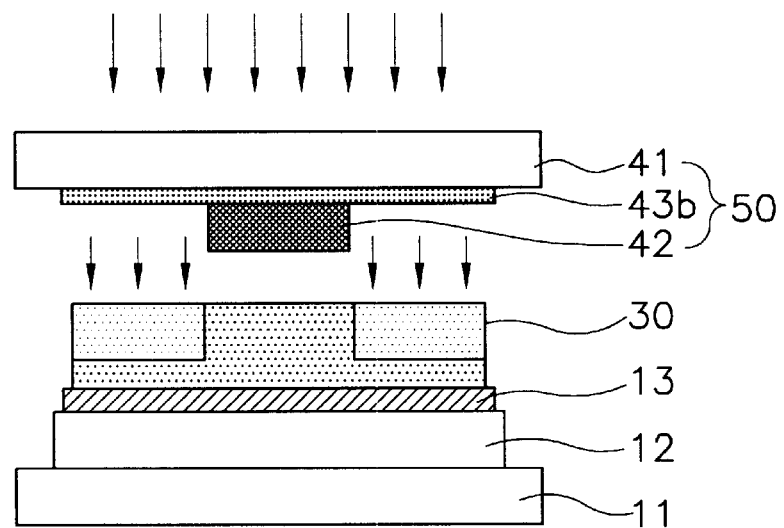

As shown in FIGS. 4A and 4B, in the semipermeable mask 50, a chrome pattern 42 for defining a light permeable region and a shield region is formed on a quartz substrate 41, and semipermeable patterns 43a, 43b for decreasing a light permeable amount are formed in a predetermined permeable region. A stripe type chrome pattern 43 as shown in FIG. 4A and a low permeable metal film 43b such as an ITO film as shown in FIG. 4B may be used as the semipermeable patterns 43a, 43b.

Figure 4C:
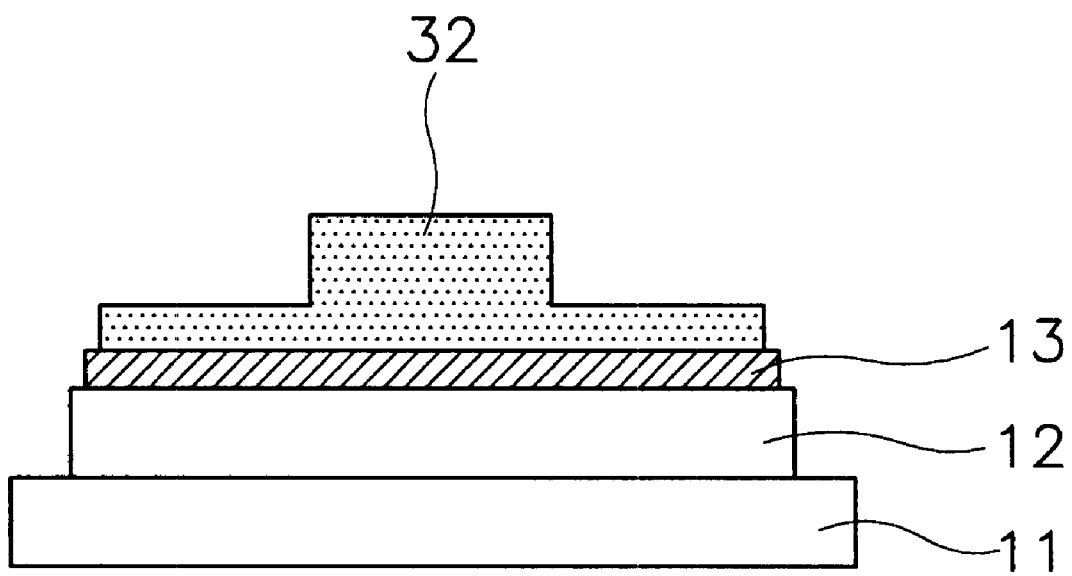

In the exposure process using the semipermeable mask 50, the ITO film 12 is deposited at a thickness below 1,000 Å, preferably from 500 to 1,000 Å, and the resist film 30 is coated at a thickness over 2 μm, preferably from 2 to 3 μm. As a result of the exposure process, a part of the resist film 30 exposed through the light permeable region where the semipermeable patterns 43a, 43b have not been formed is completely exposed, but the other part of the resist film 30 exposed through the light permeable region where the semipermeable patterns 43a, 43b have been formed is half exposed. As shown in FIG. 4C, when the completely and half exposed resist film 30 is developed, the resist pattern 32 has a different thickness in each region.

Figure 3B:
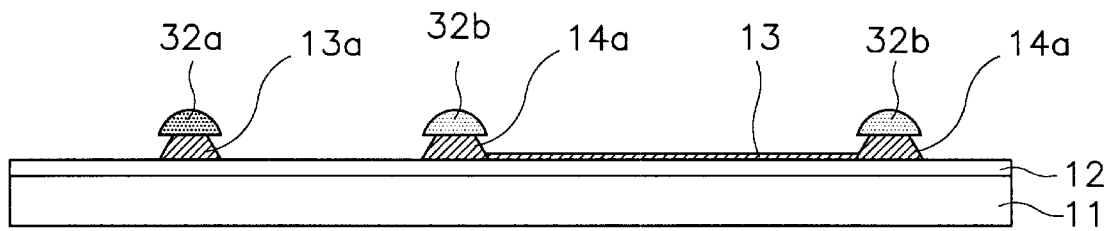

In FIG. 3B, the MoW film 13 is dry-etched by using the resist pattern 32 as an etch barrier, thereby forming a gate bus line 13a and a common electrode line 14a. Herein, the first and second patterns 32a, 32b of the resist pattern 32 partially remain on the gate bus line 13a and the common electrode line 14a, but the third pattern thereof does not remain on the counter electrode formation region. In addition, the MoW film 13 partially remains on the counter electrode formation region. The dry etching process is performed by employing a mixed gas of an excited gas such as $SF_6$, $CF_4$ or He and $O_2$ gas. A flow rate ratio of the $O_2$ gas and the excited gas is represented by the following equation 1.

$$\frac{O_2 \text{ gas flow rate}}{\text{excited gas flow rate}} < 1 \qquad \text{equation}$$

Figure 3C:
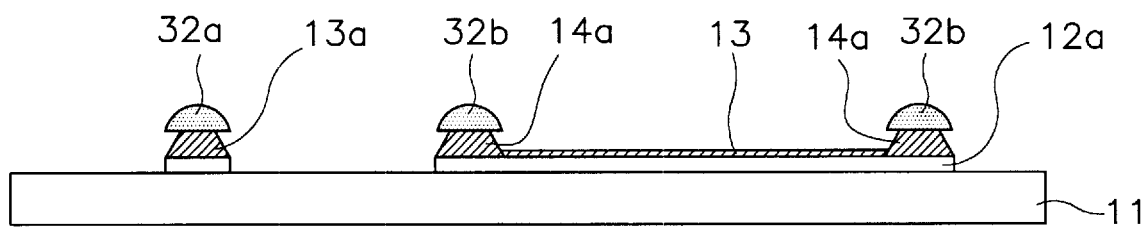

In FIG. 3C, the ITO film is wet-etched by using the residual resist patterns 32a, 32b and MoW film 13 as an etch barrier, thereby forming a counter electrode 12a.

Figure 3D:
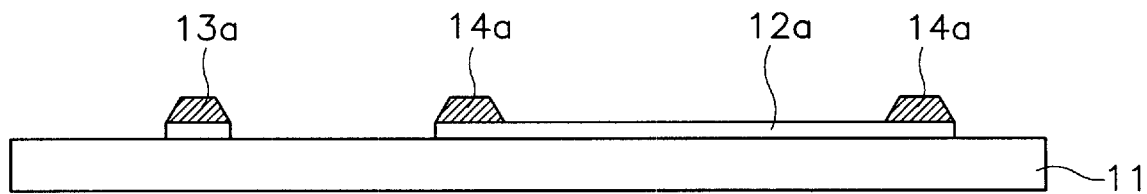

In FIG. 3D, the resist patterns 32a, 32b and the MoW film 13 are removed according to a dry strip process, and thus the first photolithography process for forming the counter electrode 12a, the gate bus line 13a and the common electrode line 14a is finished.

As described above, the counter electrode 12a, the gate bus line 13a and the common electrode line 14a are formed according to one photolithography process. That is to say, the etching process is carried out two times on the counter electrode 12a, the gate bus line 13a and the common electrode line 14a, but the resist coating, exposure and development processes for forming the etch barrier are performed one time. Since one exposure mask is employed, the counter electrode 12a, the gate bus line 13a and the common electrode line 14a are deemed to be formed according to one photolithography process. In accordance with the present invention, a manufacturing time is reduced by performing one photolithography process, and a manufacturing cost is cut down by using one exposure mask, which results in improved productivity.

Referring to FIG. 2B, a gate insulating film 15 is deposited on the glass substrate 1 where the counter electrode 12a, the gate bus line 13a and the common electrode line 14a have been formed. An undoped amorphous silicon film and a doped amorphous silicon film are sequentially deposited on the gate insulating film 15. Thereafter, the doped amorphous silicon film and the undoped amorphous silicon film are patterned according to a second photolithography process, thereby forming an ohmic contact layer 17 and a channel layer 16. A metal film for source/drain is deposited over the resultant structure. The metal film for the source/drain is patterned according to a third photolithography process, thereby forming a data bus line(not shown) including source and drain electrodes 18a, 18b. Thus, a thin film transistor (TFT) is formed.

Referring to FIG. 2C, a passivation film 19 such as a silicon nitride film is deposited over the resultant structure in order to protect the TFT. Thereafter, the passivation film 19 is etched according to a fourth photolithography process so that the source electrodes 18a can be exposed. An ITO film as a transparent metal film is deposited on the passivation film 19. The ITO film is patterned according to a fifth photolithography process, thereby forming a comb-shaped pixel electrode 20 having a few branches and contacting with the source electrodes 18a.

As described above, in accordance with the present invention, the lower substrate in the FFS mode LCD is formed according to the five photolithography processes. As compared with the conventional method, the present invention omits one photolithography process, and thus increases productivity.

Various other modifications to the basic process will be apparent to and can be readily made by those skilled in the art without departing from the scope and spirit of the present invention.

What is claimed is:

1. A method for manufacturing a fringe field switching mode liquid crystal display device, comprising the steps of:

forming a counter electrode, a gate bus line and a common electrode line at the same time, by sequentially depositing an indium tin oxide film and an MoW film on a glass substrate, and patterning the MoW film and the ITO film according to a first photolithography process;

depositing a gate insulating film over the resultant structure;

forming a stacked channel layer and ohmic contact layer on a predetermined portion of the gate insulating film, by using a second photolithography process;

forming a data bus line including source/drain electrodes on the ohmic contact layer and the gate insluting film, by using a third photolithography process;

forming a passivation film to expose the source electrode over the resultant structure, by using a fourth photolithography process; and forming a pixel electrode of a comb shape in contact with the source electrode on the passivation film, by using a fifth photolithography process, wherein the first photolithography process comprises:

a first process for coating a resist film on the MoW film;

a second process for forming a resist pattern consisting of first and second patterns respectively covering gate bus line and common electrode line formation regions and maintaining a coating thickness, and a third pattern covering a counter electrode formation region and partially maintaining the coating thickness, by exposing/developing the resist film;

a third process for forming the gate bus line and the common electrode line by dry-etching the MoW film using the resist pattern as an etch barrier, the first and second patterns being partially removed, the third pattern being completely removed, the MoW film on the counter electrode formation region being partially removed;

a fourth process for forming the counter electrode by wet-etching the ITO film using the remained resist pattern and MoW film as an etch barrier; and a fifth process for removing the remained resist pattern and MoW film.

2. The method according to claim 1, wherein the exposure process for the resist film is performed by using a semipermeable mask where a chrome pattern for defining light permeable region and shield region is formed on a quartz substrate, and semipermeable patterns for decreasing a light permeable amount are formed in a predetermined permeable region.

3. The method according to claim 2, wherein the semipermeable patterns are stripe type chrome patterns, or low permeable metal films consisting of an ITO film.

4. The method according to claim 1, wherein the ITO film for the counter electrode is deposited at a thickness from 500 to 1,000 Å.

5. The method according to claim 1, wherein the resist film is coated at a thickness from 2 to 3 $\mu$m.

6. The method according to claim 1, wherein the dry etching process for the MoW film is performed by using a mixed gas of an excited gas, such as $SF_6$, $CF_4$ or He, and $O_2$ gas.

7. The method according to claim 6, wherein a flow rate ratio of the $O_2$ gas and the excited gas satisfies following equation:

$$\frac{O_2 \text{ gas flow rate}}{\text{excited gas flow rate}} < 1. \qquad \text{equation}$$

* * * * *